(12) United States Patent
Jo

(10) Patent No.: US 6,351,430 B2
(45) Date of Patent: Feb. 26, 2002

(54) SEMICONDUCTOR MEMORY DEVICE HAVING STABLE WORDLINE OPERATIONS

(75) Inventor: Sung-Kue Jo, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/800,207

(22) Filed: Mar. 6, 2001

(30) Foreign Application Priority Data

Mar. 6, 2000 (KR) .............................. 12-11087

(51) Int. Cl.[7] ................................................ G11C 8/00
(52) U.S. Cl. .............................. 365/230.06; 365/230.03
(58) Field of Search ........................... 365/230.03, 63, 365/230.06

(56) References Cited

U.S. PATENT DOCUMENTS

| | | | | |
|---|---|---|---|---|
| 5,875,149 A | * | 2/1999 | Oh et al. ............... | 365/230.06 |
| 5,940,343 A | * | 4/1999 | Cha et al. .............. | 365/230.06 |
| 5,986,938 A | * | 11/1999 | Jang ...................... | 365/185.23 |
| 6,249,464 B1 | * | 6/2001 | Silver et al. ............. | 365/200 |

\* cited by examiner

Primary Examiner—Son T. Dinh
(74) Attorney, Agent, or Firm—F. Chau & Associates, LLP

(57) ABSTRACT

Disclosed is a semiconductor memory device comprising: a memory cell array formed of cell blocks arranged in matrix of row and column; sub wordline drivers, interposed between the cell blocks arranged along column direction, each for driving a row of the cell blocks in response to a wordline drive signal; and wordline drive signal generators, disposed between the sub wordline drivers arranged along row direction, each for providing the wordline drive signal to the corresponding sub wordline driver. The wordline drive signal generators have different drive capabilities depending upon the number of wordline drivers to be driven by the generators.

5 Claims, 2 Drawing Sheets

US 6,351,430 B2

SEMICONDUCTOR MEMORY DEVICE HAVING STABLE WORDLINE OPERATIONS

This application relies for priority upon Korean Patent Application No. 2000-11087, filed on Mar. 6, 2000, the contents of which are herein incorporated by reference in their entirety.

BACKGROUND OF THE INVENTION

1. Technical Field

The present invention relates to semiconductor memory devices, and more particularly to dynamic random access memory (DRAM) devices having hierarchical arrangements with plural wordlines.

2. Discussion of Related Art

In a DRAM device, storage capacitors (or cell capacitors) retain the values of data, the charging/discharging path thereof being controlled by respective pass transistors (or cell transistors) disposed between a bit line and the capacitor. A gate electrode of the pass transistor is coupled to a wordline, and the switching of the transistor is dependent upon the voltage level on the wordline. Typically, to be effective, the voltage on the wordline is set at least higher than the power supply voltage of the DRAM, e.g., at 4 to 5V, so that the storage capacitor is sufficiently charged through the pass transistor. Such voltage level is obtained by boosting with a wordline driver. This is called "self-boosting".

A memory cell array 10 of a DRAM, as shown in FIG. 1, is segmented into a plurality of memory cell blocks 16. Sub wordline drivers 14 are interposed between memory cell blocks 16 along column direction, and wordline drive signal generators 12 are disposed between the sub wordline drivers 14 along the row direction. The wordline drive signal generators 12 provide wordline drive signals PXiDB, PXiD, and PXiDP to corresponding sub wordline drivers 14. The wordline drive signal generators 12 are shared by the adjacent sub wordline drivers 14. Sense amplifiers 18 are arranged between the memory cell blocks 16 along the row direction.

FIG. 2 is a schematic circuit of a subwordline driver. Wordline WL is activated in response to decoding signal NWEi and the wordline drive signals PXiDB, PXiD, and PxiDP. The sub wordline driver is preferably constructed with NMOS transistors MN1, MN2, MN3, and MN6. NWEi is a decoded signal from row address signals in row decoder. The wordline drive signals PXiD, PXiDP, and PXiDB are provided from the wordline drive signal generator 12.

When NWEi is charged up to the boosted voltage level of 4~5 V (Vpp), node N1 goes to Vpp-Vt (Vt is a threshold voltage of NMOS transistor MN1) through the NMOS transistor MN1. And, when PXiDP is charged up to the boosted level Vpp together with NWEi, the voltage level at node N1 rises to 2Vpp-Vt, by means of 'self-boosting' through a junction capacitance in the NMOS transistor MN2. Therefore, the NMOS transistor MN2 is fully turned on, and thereby the voltage level on wordline WL is nearly identical to that of the wordline drive signal PXiDP. The row decoding signal NWEi and the wordline drive signal PXiDP have a self-boosting margin therebetween, which is a time interval between the boosted pulses of NWEi and PXiDP, for purposes of securing a time to pull the voltage levels up to the boosted level Vpp.

The wordline drive signal generators 12 are positioned between adjacent sub wordline drivers 14, and each generator is designed to have the same drive capability. The wordline drive signal generators 12' arranged on a side of the memory cell array 10 is more capable in boosting PXiDP because they are not shared by adjacent sub wordline drivers 14 on each side. Thus, generators 12' provide drives for one half of the wordlines in a memory cell block while the shared generators 12 provide drives for both halves of wordlines in adjacent memory cell blocks. As a result, an output signal PXiDP' from the generators 12' rises to the boosted level faster than an output signal PXiDP from the shared generators 12, causing the self-boosting margin to be reduced at the sub wordline drivers corresponding to the generators 12'. In general, the self-boosting margin over an entire chip is influenced by the generators 12' to reduce the self-boosting margin of the entire chip.

SUMMARY OF THE INVENTION

Accordingly, it is an object of the present invention to provide a semiconductor memory device having stable wordline boosting operations.

It is another object of the invention to provide wordline drive signal generators capable of securing a stable wordline boosting operation.

A semiconductor memory device of the present invention accomplishes such objects. The memory device comprising: a memory cell array formed of cell blocks arranged in matrix of row and column; sub wordline drivers, interposed between the cell blocks arranged along column direction, each for driving a row of the cell block in response to a wordline drive signal; and wordline drive signal generators, disposed between the sub wordline drivers arranged along row direction, each for providing the wordline drive signal to the corresponding sub wordline driver. The wordline drive signal generators have variable drivability dependent on the position where they are placed on the memory cell array.

According to an aspect of the invention, the wordline drive signal generations are given different drive capabilities dependent upon the number of sub wordline drivers sharing the generator. Preferably, the drive signal generators driving a smaller number of sub wordline drivers are given less drive capability. Alternatively, the wordline drive signal generators arranged on sides of the memory cell array are given lower drivability than that of the wordline drive signal generators positioned between the sub wordline drivers.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

For a better understanding of the invention, and to show how embodiments of the same may be carried into effect, reference will now be made, by way of example, to the accompanying drawings, in which.

DESCRIPTION OF PREFERRED EMBODIMENT

In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatic or block diagram form in order not to obscure the present invention.

Hereinbelow, applicable embodiments of the invention will be as follows, with the appended drawings.

Figure 1:
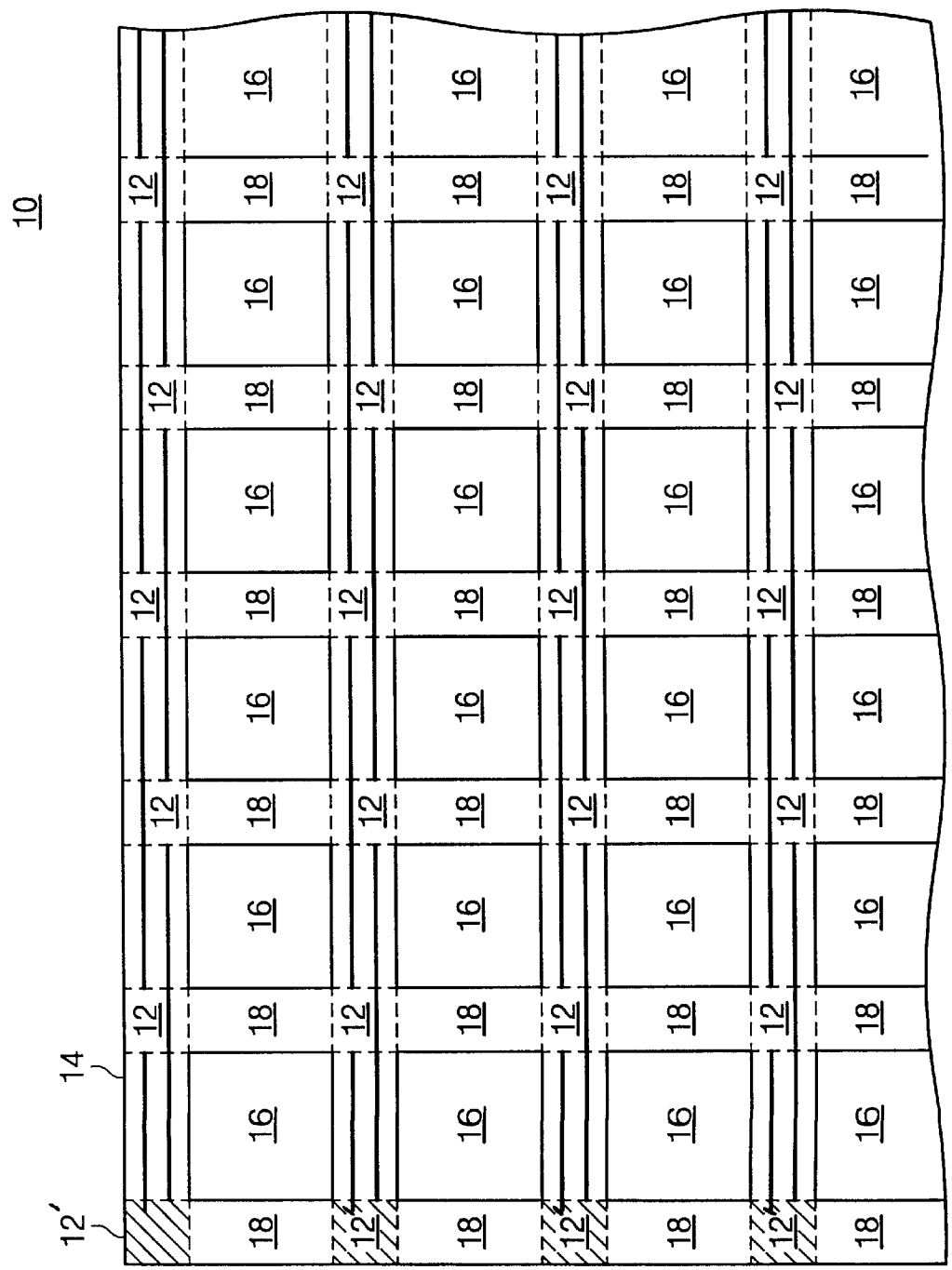
FIG. 1 is a schematic diagram illustrating a memory cell array of a general semiconductor memory device.
Figure 2:
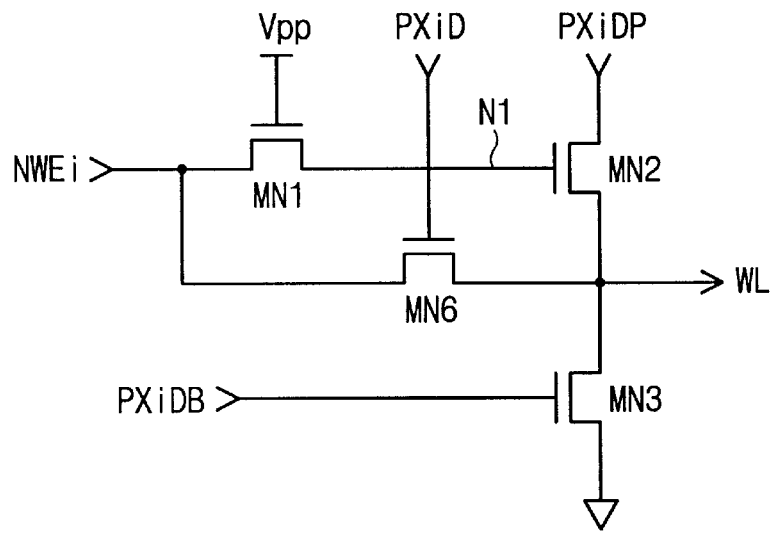
FIG. 2 is a circuit diagram of a sub wordline driver.
Figure 3:
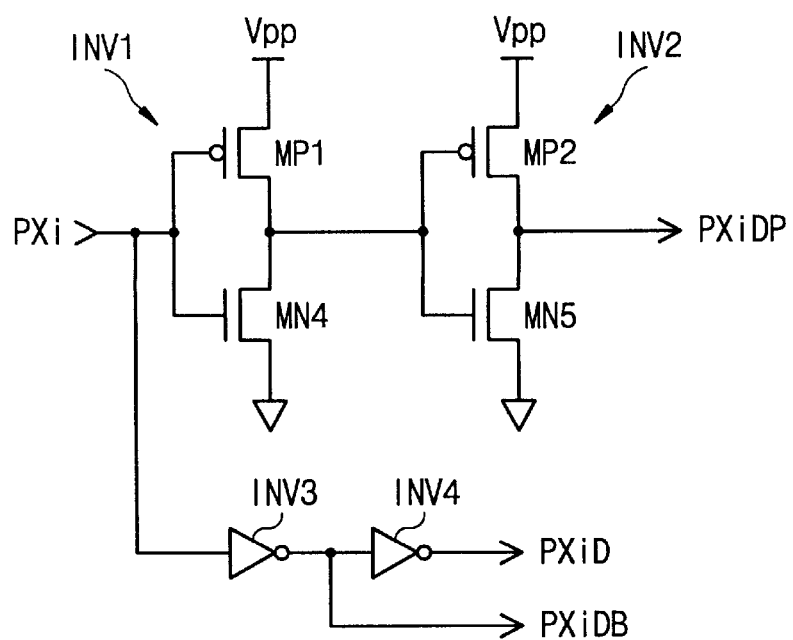
FIG. 3 is a circuit diagram of a wordline driver signal generator.

Referring to FIG. 3, a wordline drive signal generator 12 according to an embodiment of the invention is formed of four CMOS inverters INV1 through INV4, generating wordline drive signals PXiDP, PXiDB, and PXiD in response to signal PXi. The inverters INV1 and INV2 utilize a high voltage Vpp as a power supply while INV3 and INV4 employ a normal or lower voltage power supply of the memory device. PXi is converted into PXiDP through INV1 and INV2. PXi is also applied to the inverter INV3 generating PXiDB. PXiDB is converted into PXiD through INV4. The PXiDP generated from INV2 directly affects the self-boosting margin.

As aforementioned, the area occupied by the wordline drive signal generator 12 is minimized by placing the generator 12 on a region between the adjacent sub wordline drivers 14 in which the generator 12 is shared between them. Further, the wordline drive signal generator 12' (i.e., ones in the hatched blocks) arranged on the side of the memory cell array 10 has less loading capability than that of the shared wordline drive signal generators 12 positioned between the adjacent sub wordline drivers 14.

Hence, the wordline drive signal generator 12' arranged on the side of the memory cell array 10 operates a sub wordline driver of the side, while the shared wordline dive signal generators 12 are oriented to the adjacent sub wordline drivers 14. If the generators 12 and 12' have equal drive capabilities, an output signal PXiDP from the side generators 12' rises up to the boosted level more faster than an output signal PXiDP from the shared generators 12. To compensate for the difference between generators 12 and 12', the side wordline drive signal generator 12' is designed to have lower drivability than that of the shared generator 12. The size (e.g. a channel width of a transistor) of PMOS transistor MP2 of the inverter INV2 shown in FIG. 3 of side generator 12' is shrunk down to about half of a PMOS transistor MP2 of a shared wordline drive signal generator 12. That is, the drivability of the wordline drive signal generator is adjusted upon the number of wordline drivers sharing the generator. Advantageously, self-boosting margin is evenly distributed over the entire chip. Consequently, the self-boosting margin of the sub wordline driver remains stable regardless of the position of the generator.

As described above, the present invention provides the semiconductor memory device having stable wordline boosting operations by making the drivability of the wordline drive signal generator different depending on the arranged position.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A semiconductor memory device comprising:

a memory cell array formed of cell blocks arranged in matrix of row and column;

sub wordline drivers, interposed between the cell blocks arranged along column direction, each for driving a row of the cell blocks in response to a wordline drive signal; and wordline drive signal generators, disposed between the sub wordline drivers arranged along row direction, each for providing the wordline drive signal to the corresponding sub wordline driver, wherein the wordline drive signal generators have different drive capabilities depending on the number of sub wordline drivers to be driven.

2. The semiconductor memory device of claim 1, wherein the wordline drive signal generators arranged on each side of the memory cell array have lower drive capabilities than that of other wordline drive signal generators.

3. The semiconductor memory device of claim 2, wherein the wordline device signal generators arranged on each side of the memory cell array include drive transistors having a channel width about ½ of the channel width of corresponding drive transistors of the other wordline device signal generators.

4. A semiconductor memory device comprising:

a memory cell array formed of cell blocks arranged in matrix of row and column;

sub wordline drivers, interposed between the cell blocks arranged along column direction, each for driving a row of the cell blocks in response to a wordline drive signal; and wordline drive signal generators, disposed between the sub wordline drivers arranged along row direction, each for providing the wordline drive signal to the corresponding sub wordline driver, wherein the wordline drive signal generators have different drive capabilities dependent upon their position of placement in the memory cell array.

5. The semiconductor memory device of claim 4, wherein the wordline drive signal generators arranged on each side of the memory cell array have lower drive capabilities than that of other wordline drive signal generators.

* * * * *